United States Patent
Motozuka

(10) Patent No.: US 8,700,971 B2
(45) Date of Patent: Apr. 15, 2014

(54) PARALLEL RESIDUE ARITHMETIC OPERATION UNIT AND PARALLEL RESIDUE ARITHMETIC OPERATING METHOD

(75) Inventor: Hiroyuki Motozuka, Kanagawa (JP)

(73) Assignee: Panasonic Corporation, Osaka (JP)

( * ) Notice: Subject to any disclaimer, the term of this patent is extended or adjusted under 35 U.S.C. 154(b) by 1255 days.

(21) Appl. No.: 12/377,772

(22) PCT Filed: Aug. 21, 2007

(86) PCT No.: PCT/JP2007/066156
§ 371 (c)(1),
(2), (4) Date: Feb. 17, 2009

(87) PCT Pub. No.: WO2008/023684
PCT Pub. Date: Feb. 28, 2008

(65) Prior Publication Data
US 2010/0198892 A1    Aug. 5, 2010

(30) Foreign Application Priority Data

Aug. 22, 2006  (JP) ................................ 2006-225934

(51) Int. Cl.
*H03M 13/00*    (2006.01)
(52) U.S. Cl.
USPC .......................................... 714/758; 714/776
(58) Field of Classification Search
USPC ................................................ 714/758, 776
See application file for complete search history.

(56) References Cited

U.S. PATENT DOCUMENTS

| 7,191,383 | B2 | 3/2007 | Lin et al. | |
| 7,428,693 | B2 | 9/2008 | Obuchi et al. | |
| 8,051,359 | B2 | 11/2011 | Lin et al. | |
| 2001/0056563 | A1* | 12/2001 | Kodama et al. | 714/758 |
| 2002/0114529 | A1 | 8/2002 | Horie | |
| 2004/0070526 | A1 | 4/2004 | Horie | |

(Continued)

FOREIGN PATENT DOCUMENTS

| JP | 8-149017 | 6/1996 |
| JP | 2001-036414 | 2/2001 |

(Continued)

OTHER PUBLICATIONS

Imai, "Coding theory", the Institute of Electronics, Information, and Communication Engineers, Mar. 1990.

(Continued)

*Primary Examiner* — M. Mujtaba K Chaudry
(74) *Attorney, Agent, or Firm* — Greenblum & Bernstein, P.L.C.

(57) ABSTRACT

A parallel residue arithmetic operation unit is provided to reduce processing delay, and to make an additional multiplier or a residue arithmetic circuit unnecessary, so that a circuit can become small in size. In the parallel residue arithmetic operation unit, a parallel CRC calculation circuit includes input terminals to which input data are divided into a plurality of sub-blocks and the sub-blocks are input in parallel, an initial value generating unit for generating a part CRC corresponding to the forefront of each sub-block as an initial value, a part CRC generating unit for receiving the part CRC corresponding to the forefront of each sub-block as the initial value and sequentially generating a residue part CRC in accordance with a recurrent equation, AND units for calculating logical multiplications of part CRC values, and a cumulative adding unit for cumulatively adding values output from the AND units.

14 Claims, 20 Drawing Sheets

(56) References Cited

U.S. PATENT DOCUMENTS

| | | |
|---|---|---|
| 2004/0194000 A1 | 9/2004 | Lin et al. |
| 2005/0086571 A1* | 4/2005 | Farnsworth .................. 714/758 |
| 2005/0097432 A1* | 5/2005 | Obuchi et al. ................. 714/800 |
| 2007/0162823 A1 | 7/2007 | Lin et al. |

FOREIGN PATENT DOCUMENTS

| | | |
|---|---|---|
| JP | 2002-319867 | 10/2002 |
| JP | 2003-523682 | 8/2003 |
| JP | 2005-006188 | 1/2005 |
| JP | 2006-521730 | 9/2006 |
| WO | 2003/090362 | 10/2003 |

OTHER PUBLICATIONS

English language Abstract of JP 8-149017, Jun. 7, 1996.
English language Abstract of JP 2003-523682, Aug. 5, 2003.
English language Abstract of JP 2005-006188, Jan. 6, 2005.
International Search Report, mailed Oct. 23, 2007, in corresponding International Application No. PCT/JP2007/066156.

* cited by examiner

PRIOR ART

PRIOR ART

| CIRCUIT NUMBER | INPUT DATA NUMBER | DEFAULT VALUE | PARTIAL CRC CODES TO BE GENERATED |
|---|---|---|---|
| 1 | 0~M-1 | DM{N-1+c}(D) | DM{N-1+c-1}(D) ~DM{N-1+c-(M-1)}(D) |
| 2 | M~2M-1 | DM{N-1+c-M}(D) | DM{N-1+c-(M+1)}(D) ~DM{N-1+c-(2M-1)}(D) |
| 3 | 2M~3M-1 | DM{N-1+c-2M}(D) | DM{N-1+c-(2M+1)}(D) ~DM{N-1+c-(3M-1)}(D) |
| 4 | 3M~N-1 | DM{N-1+c-3M}(D) | DM{N-1+c-(3M+1)}(D) ~DM{N-1+c-(N-1)}(D) |

FIG.8

| CIRCUIT NUMBER | INPUT DATA NUMBER | DEFAULT VALUE | PARTIAL CRC CODES TO BE GENERATED |
|---|---|---|---|
| 1 | 0~M-1 | DM{N-1+c}(D) | DM{N-1+c-1}(D) ~DM{N-1+c-(M-1)}(D) |
| 2 | 2M-1~M | DM{N-1+c-(2M-1)}(D) | DM{N-1+c-(2M-2)}(D) ~DM{N-1+c-M}(D) |
| 3 | 2M~3M-1 | DM{N-1+c-2M}(D) | DM{N-1+c-(2M+1)}(D) ~DM{N-1+c-(3M-1)}(D) |
| 4 | N-1~3M | DM{N-1+c-(N-1)}(D) | DM{N-1+c-(N-2)}(D) ~DM{N-1+c-3M)}(D) |

FIG.19

PARALLEL RESIDUE ARITHMETIC OPERATION UNIT AND PARALLEL RESIDUE ARITHMETIC OPERATING METHOD

TECHNICAL FIELD

The present invention relates to a parallel residue operator and parallel residue operation method. For example, the present invention relates to a parallel residue operator and parallel residue operation method for receiving as input outputs from, for example, turbo decoders and detecting errors in digital information.

BACKGROUND ART

CRC (Cyclic Redundancy Check) code is used in various fields such as wireless packet communication or recording discs such as optical discs. For example, in a wireless communication system, errors are likely to occur in transmission data in a radio channel because communication is carried out through a radio link, and so an error correction circuit using CRC code is provided. CRC bits are generated based on a transmission data sequence at the transmitting end and are added to the tail of the transmission data sequence. The bit sequence to which the CRC bits are added is encoded using a coding scheme such as convolution coding or turbo coding, and the resulting encoded bit sequence is transmitted.

Non-Patent Document 1 discloses the principle of CRC code in detail.

FIG. 1 illustrates how CRC code is used.

In FIG. 1, input data sequence A from input source 11 is subjected to CRC coding in CRC coding section 12 and is transmitted as transmission data sequence B to the receiving end through channel 13. Channel 13 is, for example, a radio channel, and bit error E (i.e. noise) is added to the transmission data sequence B. The receiving end receives transmission data sequence B' to which bit error E is added, carries out a CRC check in CRC check section 14 and gives received data A' based on the CRC check to the outputting end 15 (i.e. sink). Here, Assume that a wireless communication system employs HARQ (Hybrid Auto Repeat reQuest) combining turbo coding with high error correction capability and ARQ (Auto Repeat reQuest). Then when CRC check section 14 carries out a CRC check and detects an error occurring situation, and, if no error occurs, CRC check section 14 outputs received data A' of data sequence A and forms an ACK signal as an ACK/NACK signal to be transmitted to the communicating party. By contrast with this, if errors occur, CRC check section 14 does not output received data and forms a NACK signal as an ACK/NACK signal to be transmitted to the communicating party.

This will be described more generally.

Assume that the input data sequence of n bits is A=$[a_0 a_1 \ldots a_{n-2} a_{n-1}]$. $a_0$ is the MSB (Most Significant Bit), that is, the bit to be transmitted first. Assuming that $a_0, \ldots,$ and $a_{n-1}$ are used as elements of GF(2) (that is, adopt a value of 0 or 1), and the bit sequence is represented by a polynomial equation as in following equation 1.

(Equation 1)

$$A(D) = \sum_{i=0}^{n-1} a_i D^{n-1-i} \qquad [1]$$
$$= a_0 D^{n-1} + a_1 D^{n-2} + \ldots + a_{n-3} D^2 + a_{n-2} D + a_{n-1}$$

Input data sequence A is subjected to CRC coding and becomes B in following equation 2. CRC coding, which is generally used, is carried out by adding the bit sequence of length c to the tail of the input data sequence of n bits. The added c bits are also referred to as "CRC code."

$$B = [a_0 a_1 \ldots a_{c-2} a_{c-1} r_0 r_1 \ldots r_{c-2} r_{c-1}] \qquad \text{(Equation 2)}$$

If CRC code is represented by the polynomial equation of following equation 3, B is represented by the polynomial equation of following equation 4.

(Equation 3)

$$R(D) = \sum_{i=0}^{c-1} r_i D^{c-1-i} \qquad [2]$$
$$= r_0 D^{c-1} + r_1 D^{c-2} + \ldots + r_{c-2} D + r_{c-1}$$

(Equation 4)

$$B(D) = A(D) D^c + R(D)$$

In CRC coding, R(D) is determined for the predetermined polynomial G(D) of the order c determined in advance such that B(D) can be divided by G(D). That is, R(D) is the residue obtained by diving A (D) $D^c$ by G(D).

Above G(D) is referred to as the "generator polynomial" and is represented by following equation 5.

(Equation 5)

$$G(D) = D^c + \sum_{i=0}^{c-1} g_i D^{c-1-i} \qquad [3]$$
$$= D^c + g_0 D^{c-1} + g_1 D^{c-2} + \ldots + g_{c-3} D^2 + g_{c-2} D + g_{c-1}$$

There may be a case below where the order c of the generator polynomial is referred to as "the order of CRC code."

To sum up the above, following equation 6 holds. Q (D) is the quotient obtained by dividing A (D) $D^c$ by G(D).

$$B(D) = A(D) D^c + R(D) = G(D) Q(D) \qquad \text{(Equation 6)}$$

n+c bits subjected to CRC coding as described above are transmitted through channel 13. Bit error E (D) (i.e. noise) is added in channel 13.

CRC check is carried out by checking whether or not received value B' (D)=B (D)+E (D) can be divided by G(D). When there is no bit error with the received value (that is, when E (D)=0), B' (D) can be divided by G(D). When there is a bit error with the received value, if E (D) cannot be divided by G(D), B' (D) cannot be divided G(D). Consequently, it is possible to detect whether a bit error has occurred in the channel. If E(D) can be divided by G(D), it is not possible to detect whether or not there is an error by CRC code. However, if the length of c is sufficient, the probability of occurrence of a case where E(D) can be divided by G(D) is low. The values, such as 32 to 8, are usually used for c.

FIG. 2 illustrates how CRC code applied to a more practical system is used.

In FIG. 2, input data A (D) from information source 21 is subjected to CRC coding in CRC coding section 22, and data B(D) subjected to CRC coding is transmitted as transmission data C(D) from error correction coding section 23 to the receiving end through channel 24. The transmitting end carries out CRC coding and then error correction coding. For example, Reed Solomon code, convolution code and turbo code are used for the method of error correction coding.

There is a case where bit error E (i.e. noise) is added in channel 24. The receiving end receives transmission data sequence C'(D) to which bit error E is added, outputs transmission data B'(D) by carrying out error correction decoding in error correction decoding section 25, carries out a CRC check in CRC check section 26 and gives received data A' based on the CRC check to outputting end 27 (i.e. sink). The receiving end decodes error correction code. By this means, most of the bit errors added in channel 24 are removed. In CRC check in CRC check section 26, whether or not there are errors that cannot be removed by error correction decoding, is checked.

CONVENTIONAL EXAMPLE 1

Sequential CRC Calculating Circuit

FIG. 3 shows a configuration of the sequential CRC calculating circuit which is generally known.

In FIG. 3, sequential CRC calculating circuit 30 is composed of EXOR (exclusive disjunction) circuits 31, flip flops (FF) 32 of [0] to [c−1] and AND circuits 33.

FIG. 3 shows a general configuration using shift registers where the input data sequence is inputted per bit from the head per clock cycle.

In CRC coding of sequential CRC calculating circuit 30, $a_0$ to $a_{n-1}$ are inputted per bit to the input terminal shown by a [t]. After all bits are inputted, the values of c bits held in the flip flops (FF) are the CRC operation result.

In CRC check, after data B'(D) of received n+c bits is inputted per bit, whether or not the values left in the flip flops are zero is decided. Also CRC check may be performed by inputting n bits from the head of B'(D) and then deciding whether or not the values left in the flip flops match the rest of the c bits of B'(D).

However, according to this configuration, if an input is n bits, there is a problem that CRC coding requires at least n clock cycles and the long processing delay time.

CONVENTIONAL EXAMPLE 2

The Method of Calculating Partial CRC Codes

Patent Document 1 discloses a partial CRC code calculating method of reducing the processing delay time by calculating partial CRC codes.

In Patent Document 1, the equation for the residue R (D) is changed as in following equation (7).

(Equation 7)

$$R(D) = A(D) \bmod G(D) \quad [4]$$
$$= \left(\sum_{i=0}^{n-1} a_i D^{n-1+c-i}\right) \bmod G(D)$$
$$= \sum_{i=0}^{n-1} (a_i D^{n-1+c-i} \bmod G(D))$$

By finding the values (i.e. partial CRC codes) of $D^{n-1+c-i}$ mod G(D) (i=0 to n−1) in advance and inputting input data in parallel in one time, CRC code can be determined in one clock cycle.

FIG. 4 shows a configuration of a partial CRC code circuit in case where n=16 and c=24 in above equation 7.

In FIG. 4, partial CRC code circuit 40 is composed of operation target bit sequences A[0] to A[15] input terminals 41, AND circuits 42 that acquire AND of bit sequences A[0] to A[15] and partial CRC codes calculated in advance and adding circuit 43 that adds up the partial CRC codes.

AND circuits 42 decode effective values of operation target bit sequences of the partial CRC codes calculated in advance to partial CRC codes, and adding circuit 43 finds CRC code for the overall operation target bit sequences.

However, according to the configuration of the degree of the parallelism n disclosed in Patent Document 1, if n increases, the circuit scale increases significantly. It may be possible to decrease the degree of the parallelism and sequentially input portions of data, but calculating arbitrary partial CRC codes for i=0 to n−1 immediately is difficult for the circuit scale and processing delay. Therefore, although it is necessary to find all partial CRC codes in advance, if n is great, the memory capacity to hold partial CRC codes increases, thereby increasing cost.

CONVENTIONAL EXAMPLE 3

The Method for Dividing Data into Subblocks

Further, Patent Documents 2 and 3 disclose a subblock dividing type parallel CRC circuit that divides data into subblocks and carries out parallel processing. In Patent Documents 2 and 3, the equation for the residue R(D) is changed as in following equation (8).

(Equation 8)

$$R(D) = A(D) \bmod G(D) \quad [5]$$
$$= \left(\sum_{i=0}^{n-1} a_i D^{n-1+c-i}\right) \bmod G(D)$$
$$= \left(\sum_{i=m}^{n-1} a_i D^{n-1+c-i}\right) \bmod G(D) + \left(\sum_{i=0}^{m-1} a_i D^{n-1+c-i}\right) \bmod G(D)$$
$$= \underbrace{\left(\left(\left(\sum_{i=0}^{n-m-1} a_{m+i} D^{n-m-1+c-i}\right) \bmod G(D)\right) D^m \bmod G(D)\right)}_{(a)}$$
$$\bmod G(D) + \underbrace{\left(\sum_{i=0}^{m-1} a_i D^{n-1+c-i}\right) \bmod G(D)}_{(b)}$$

That is, data of length n in above equation 8 is divided into lengths m and n−m for (a) CRC calculation of length n−m and (b) CRC calculation of length m.

However, according to this subblock dividing method, the result of (a) should be multiplied by $D^m$ mod G(D) to calculate the residue of (c) divided by G(D). Multipliers and residue calculators are additionally necessary for these processings, thereby increasing the circuit scale and processing delay.

There is a serial-to-parallel converting type parallel CRC circuit used for the most popular parallelization method.

FIG. 5A and FIG. 5B show a serial-to-parallel converting type parallel CRC circuit. In FIG. 5A, S/P converting type parallel CRC circuit 50 is composed of S/P converter 51 and parallel CRC circuit 52.

As shown in FIG. 5B, S/P converting type parallel CRC circuit 50 carries out a serial-to-parallel conversion of an input in S/P converter 51 and carries out CRC calculation by parallel processing in parallel CRC circuit 52. The parallel processing is carried out, for example, per byte. There are a great number of implementation and application examples of this parallelization method in hardware and software.

Non-Patent Document 1: "Coding theory," Hideki IMAI, the Institute of Electronics, Information, and Communication Engineers, March 1990

Patent Document 1: Japanese Patent Application Laid-Open No. HEI8-149017

Patent Document 2: Japanese Translation of PCT Application Laid-Open No. 2003-523682

Patent Document 3: Japanese Patent Application Laid-Open No. 2005-006188

DISCLOSURE OF INVENTION

Problems to be Solved by the Invention

However, such a conventional CRC calculating circuit has the following problems.

(1) As described above, a sequential CRC calculating circuit requires a significant processing delay time, and a partial CRC code circuit increases the cost because the memory capacity to hold partial CRC codes increases.

(2) The subblock dividing type parallel CRC circuit is necessary for the following reasons.

The output of a parallel turbo decoder is inform of divided subblocks, and so, if a subblock dividing type parallel CRC circuit is applicable, the output can be inputted directly without a memory. That is, given that the output of a parallel turbo decoder is inputted directly to the CRC calculating circuit, a parallel CRC calculating circuit (which, for example, divides a data sequence into small blocks of length M) needs to be the subblock dividing type instead of a serial-to-parallel converting type (which, for example, processes the output from the head per byte). Consequently, compared to the case where an S/P type parallel CRC circuit is used, a subblock dividing type parallel CRC circuit does not require a memory which becomes an interface, thereby reducing the processing delay, the circuit scale and current. However, this subblock dividing type parallel CRC circuit carries out parallel processing by dividing data into subblocks and therefore additionally requires residue calculators such as multipliers and adders subsequent to a plurality of CRC residue generators that carry out parallel processing, thereby increasing the circuit scale and processing delay.

(3) The serial-to-parallel converting type parallel CRC circuit requires an interface memory, thereby increasing processing delay, causing delay in ACK transmission and increasing consumption of the current due to delay resulting from iterative stop.

As described above, although a subblock dividing type parallel CRC circuit provides a great advantage for use in combination with a parallel turbo decoder that carries out subblock division, in a conventional subblock type dividing parallel CRC circuit, processing delay and the circuit scale are significant, so that there is a need for a CRC circuit with little processing delay and circuit scale.

It is therefore an object of the present invention to provide a parallel residue operator that makes it possible to reduce the processing delay and does not require an additional multiplying circuit and residue circuit, thereby making the circuit scale smaller.

Means for Solving the Problem

The parallel residue operator according to the present invention, to which input data divided into a plurality of subblocks is inputted in parallel, employs a configuration including: a initial value generating section that generates partial residues matching head portions of the subblocks as initial values; a partial residue generating section that receives the partial residues matching the heads of the subblocks from the initial value generating section as the initial values and sequentially generates a rest of partial residues according to a predetermined recurrence equation; a logic section that calculates a logical operation of the input data and values of partial residues outputted from the partial residue generating section; and a cumulative adding section that cumulatively adds the values outputted from the logic section.

The parallel residue operator according to the present invention, to which input data divided into a plurality of subblocks is inputted in parallel, employs a configuration including: a initial value generating section that generates partial residues matching tail portions of the subblocks as initial values; a reverse order partial residue generating section that receives the partial residues matching the tail portions of the subblocks from the initial value generating section as the initial values and sequentially generates a rest of partial residues according to a predetermined recurrence equation; a logic section that calculates a logical operation of the input data and values of reverse order partial residues outputted from the reverse order partial residue generating section; and a cumulative adding section that cumulatively adds the values outputted from the logic section.

The parallel residue operation method according to the present invention includes: dividing input data of a length n into data sequences of lengths n-m and m, and, when the individual divided data sequences are used as subblocks, calculating in advance as initial values $D^{n-1+c}$ mod $G(D)$ and $D^{n-1+c-m}$ mod $G(D)$, which are partial residues at head portions of subblocks of i=0 and m, according to a value of a polynomial $G(D)$ determined by a maximum order c; and sequentially calculating partial residues matching i=1 to m−1 and i=m+1 to n−1 using $D^{n-1+c}$ mod $G(D)$ and $D^{n-1+c-m}$ mod $G(D)$ as the initial values.

The parallel residue operation method according to the present invention includes: dividing input data of a length n into data sequences of lengths n-m and m, and, when the individual divided data sequences are used as the subblocks, calculating in advance as initial values $D^{n-1+c-(m-1)}$ mod $G(D)$ and $D^{n-1+c-(n-1)}$ mod $G(D)$, which are partial residues at tail portions of subblocks of i=m−1 and n−1, according to a value of a polynomial $G(D)$ determined by a maximum order c; and sequentially calculating reverse order partial residues matching i=m−2 to 0 and i=n−2 to m using $D^{n-1+c-(m-1)}$ mod $G(D)$ and $D^{n-1+c-(n-1)}$ mod $G(D)$ as the initial values.

Advantageous Effect of the Invention

According to the present invention, processing delay can be reduced, all partial CRC codes need not to be stored and an additional multiplication circuit and residue circuit are not required, thereby making the circuit scale smaller. Particularly, when used in combination with a parallel turbo decoder that carries out subblock division, the present invention is able to reduce the processing delay significantly.

BRIEF DESCRIPTION OF DRAWINGS

FIG. 8 shows a table organizing partial CRC codes calculated by a partial CRC code generating section of the parallel residue operator according to above Embodiment 1;

FIG. 19 shows a table organizing partial CRC codes calculated by partial CRC code generating sections of the parallel residue operator according to above Embodiment 2.

BEST MODE FOR CARRYING OUT THE INVENTION

Figure 1:
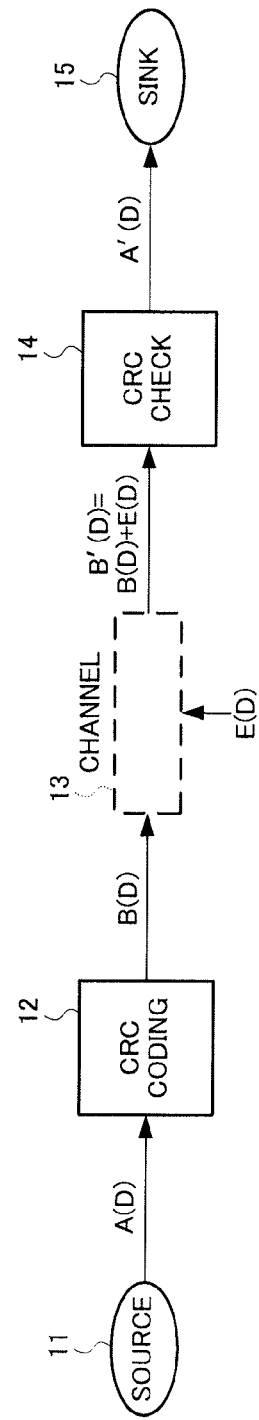
FIG. 1 illustrates how CRC code is used.
Figure 2:
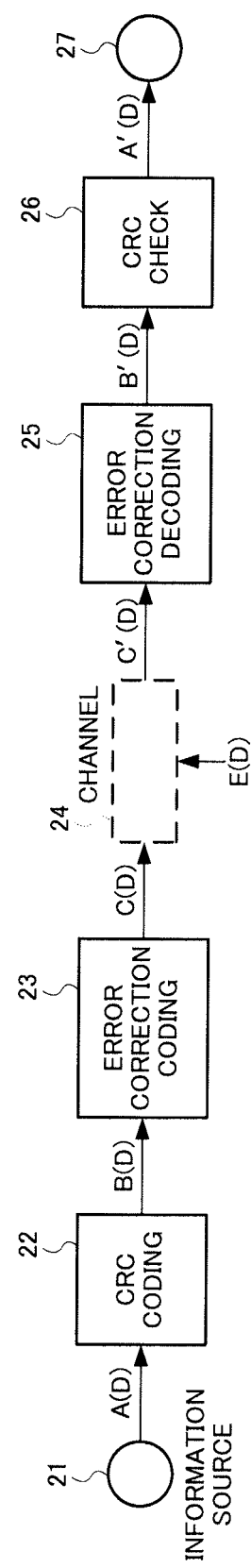
FIG. 2 illustrates how CRC code applied to a practical system is used.
Figure 3:
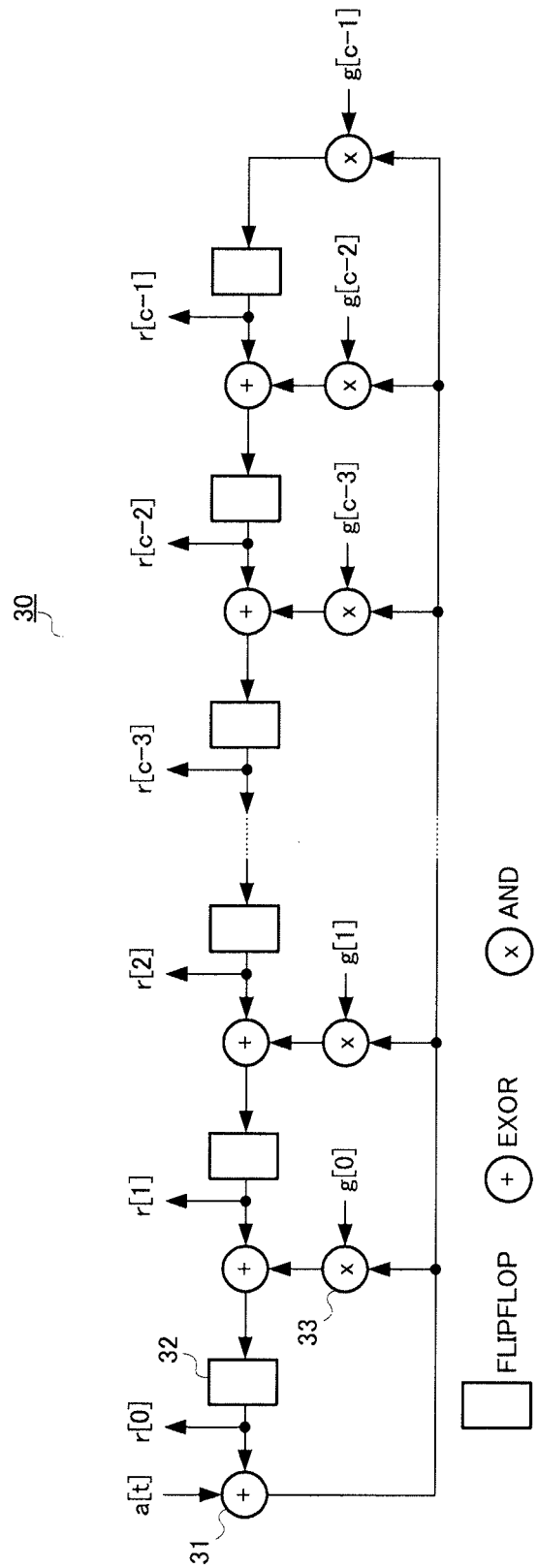
FIG. 3 shows a configuration of a conventional CRC calculating circuit.
Figure 4:
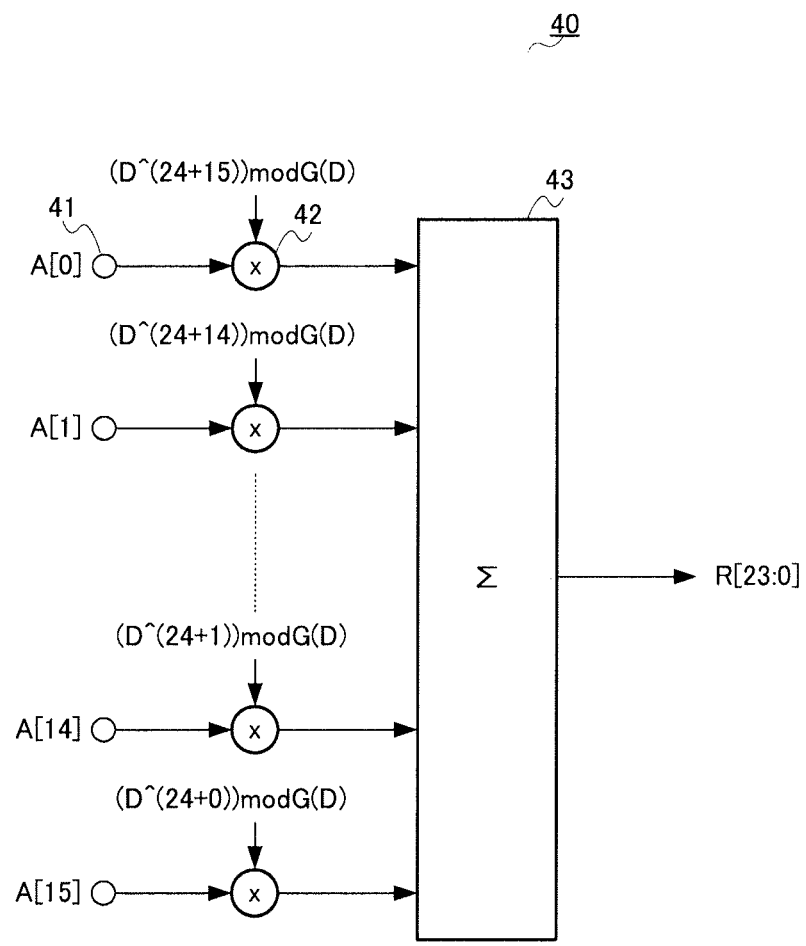
FIG. 4 shows a configuration of a conventional partial CRC code circuit.
Figure 5A:
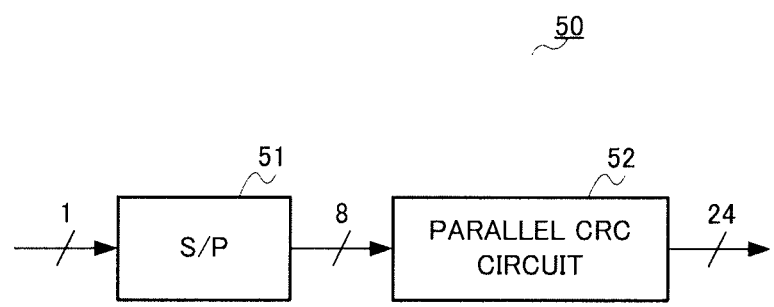
FIG. 5A shows a conventional serial-to-parallel converting type parallel CRC circuit.
Figure 5B:
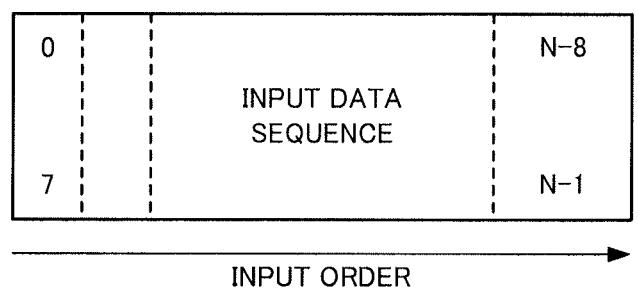
FIG. 5B shows a conventional serial-to-parallel converting type parallel CRC circuit.

Embodiments of the present invention will be described in detail with reference to the accompanying drawings.

(Basic Principle)

First, the basic principle of the present invention will be described.

The present invention provides [point 1] that relates to the overall configuration, [point 2] that relates to a partial CRC code generating circuit and [point 3] that relates to the partial CRC code generating circuit (reverse order).

[Point 1]: Regarding the Overall Configuration

According to the present invention, the equation for the residue R(D) is changed as in following equation (9).

(Equation 9)

$$R(D) = A(D) \bmod G(D) \quad [6]$$
$$= \sum_{i=0}^{n-1} (a_i D^{n-1+c-i} \bmod G(D)) +$$
$$= \underbrace{\sum_{i=0}^{m-1} (a_i D^{n-1+c-i} \bmod G(D))}_{(a)} +$$
$$\underbrace{\sum_{i=m}^{n-1} (a_i D^{n-1+c-i} \bmod G(D))}_{(b)}$$

That is, similar to the above conventional example 2 (i.e. the method of calculating partial CRC codes), the equation is changed such that CRC code is calculated as a sum of partial CRC codes ($D^{n-1+c-i} \bmod G(D)$), and, further, similar to the above conventional example 3 (i.e. the method of dividing data into subblocks), data of length n is divided into length n-m and length m. Individual divided data sequences are referred to as "subblocks." Input data is divided into $a_0$ to $a_{m-1}$ matching (a) in above equation (9) and $a_m$ to $a_{n-1}$ matching (b), and high-speed calculation is realized by calculating $a_0$ to $a_{m-1}$ and $a_m$ to $a_{n-1}$ in parallel.

In this case, with the present invention, partial residues (i.e. partial CRC codes) are calculated as follows. Input data is sequentially given (inputted) per bit in order from $a_0$ to $a_{m-1}$ and in order from $a_m$ to $a_{n-1}$ to subblock 1 matching (a) in above equation (9) and subblock 2 matching (b) in above equation (9), respectively.

[Step 1] The partial CRC code values (that is, the partial CRC codes at the head portions of subblocks) $D^{n-1+c} \bmod G(D)$ and $D^{n-1+c-m} \bmod G(D)$ in case of i=0, m are determined in advance.

[Step 2] The partial CRC codes matching i=1 to m−1 and i=m+1 to n−1 are sequentially calculated using the above two values as the initial values.

The above calculating method is employed, so that the subblock dividing type parallel CRC circuit according to the present invention has features that (1) all partial CRC codes need not to be stored and (2) the subblock dividing parallel CRC circuit is small and produces a little delay because an additional multiplying circuit and residue circuit are not necessary.

[Point 2]: Regarding the Partial CRC Code Generating Circuit

A suitable method for sequentially calculating the other partial CRC codes based on the above partial CRC codes at the head portions of subblocks, will be described.

If the generator polynomial is following equation (10), the generator polynomial of CRC code generally used has a feature that the value of the coefficient $g_{c-1}$ of the term of the lowest order is one.

(Equation 10)

$$G(D) = D^c + \sum_{i=0}^{c-1} g_i D^{c-1-i} \quad [7]$$
$$= D^c + g_0 D^{c-1} + g_1 D^{c-2} + \ldots + g_{c-3} D^2 + g_{c-2} D + g_{c-1}$$

By utilizing this feature, according to the recurrence equation shown in following equation (11), the value of $D^{T-1}$ mod $G(D)$ can be determined at ease from the value of $D^T$ mod $G(D)$.

(Equation 11)

When $DM_T(D) = D^T \mathrm{mod} G(D)$, [8]
$DM_{T-1}(D) =$ $$\begin{cases} (DM_T(D) + G(D)) \gg 1 & \text{when} \begin{pmatrix} \text{the coefficient of the lowest} \\ \text{order of } DM_T(D) \text{ is } 1 \end{pmatrix}, \\ DM_T(D) \gg 1 & \text{when} \begin{pmatrix} \text{the coefficient of the lowest} \\ \text{order of } DM_T(D) \text{ is } 0 \end{pmatrix}. \end{cases}$$

The operator $\gg$ is defined as follows.

When $A(D) = \sum_{i=0}^{n-1} a_i D^i$, $(A(D) \gg 1) = \sum_{i=1}^{n-1} a_i D^{i-1}$ Further, the operation $\gg$ can be realized by shift registers alone.

Further, the coefficient of the lowest order of $DM_T(D)$ refers to the coefficient of $D^0$ of $DM_T(D)$. (When $DM_T(D) = \sum_{i=0}^{n-1} a_{T,i} D^i$, the coefficient of $D^0$ is $a_{T,0}$.)

As described above, parallel CRC calculation described in above [point 1] can be realized efficiently according to the following steps.

[Step 1'] $DM_{n-1+c}(D) = D^{n-1+c}$ mod $G(D)$ and $DM_{n-1+c-m}(D) = D^{n-1+c-m}$ mod $G(D)$ are determined in advance.

[Step 2'] Based on $DM_{n-1+c}(D)$, partial CRC codes ($DM_{n-1+c-1}(D)$ to $DM_{n-1+c-(m-1)}(D)$) matching $i=1$ to $m-1$ and partial CRC codes ($DM_{n-1+c-(m+1)}(D)$ to $DM_{n-1+c-n}(D)$) matching $i=m+1$ to $n-1$, are sequentially calculated.

As described above, a method of sequentially calculating partial CRC codes using shift registers is employed, so that the subblock dividing type parallel CRC circuit according to the present invention can be made small and can calculate partial CRC codes without division operations on the polynomials defined in mod $G(D)$.

[Point 3]: Regarding the Partial CRC Code Generating Circuit (Reverse Order)

Although data of each subblock is inputted in natural order (for example, in order from $a_0$ to $a_{m-1}$) according to the original order of data, a parallel CRC calculating circuit that inputs data in reverse order (for example, in order from $a_{m-1}$ to $a_0$) can be realized.

That is, in following calculation equation 12, data is inputted in order from $a_{m-1}$ to $a_0$ in subblock 1 and data is inputted in order from $a_{n-1}$ to $a_m$ in subblock 2, which is effective particularly when the output of the turbo decoder is inputted directly to a parallel CRC calculator.

(Equation 12)

$R(D) = A(D) \mathrm{mod} G(D)$ [9]

$= \sum_{i=0}^{n-1} (a_i D^{n-1+c-i} \mathrm{mod} G(D))$ $= \sum_{i=m}^{n-m-1} (a_i D^{n-1+c-i} \mathrm{mod} G(D)) + \sum_{i=0}^{m-1} (a_i D^{n-1+c-i} \mathrm{mod} G(D))$ The steps of generating partial CRC codes are as follows.
[Step 1] The partial CRC code values (that is, partial CRC codes at the tail portions of subblocks) $D^{n-1+c-(m-1)}$ mod $G(D)$ and $D^{n-1+c-(n-1)}$ mod $G(D)$ in case of $i=m-1$ and $n-1$ are determined in advance.
[Step 2] The partial CRC codes matching $i=m-2$ to 0 and $i=n-2$ to $m$, are sequentially calculated using the above two values as the initial values.

With the suitable method, following recurrence equation 13 may be used.

(Equation 13)

When $DM_T(D) = D^T \mathrm{mod} G(D)$, [10]
$DM_{T+1}(D) =$ $$\begin{cases} DM_T(D)D + G(D) & \text{when} \begin{pmatrix} \text{the coefficient of the highest} \\ \text{order of } DM_T(D) \text{ is } 1 \end{pmatrix}, \\ DM_T(D)D & \text{when} \begin{pmatrix} \text{the coefficient of the highest} \\ \text{order of } DM_T(D) \text{ is } 0 \end{pmatrix}. \end{cases}$$

As described above, the method of sequentially generating partial CRC codes in reverse order is employed, so that, even when data is (partially) in reverse order, the subblock dividing type parallel CRC circuit according to the present invention is able to carry out CRC calculation without a rearranging operation. Consequently, the processing delay resulting from the rearranging operation can be eliminated.

Embodiment 1

Figure 6:
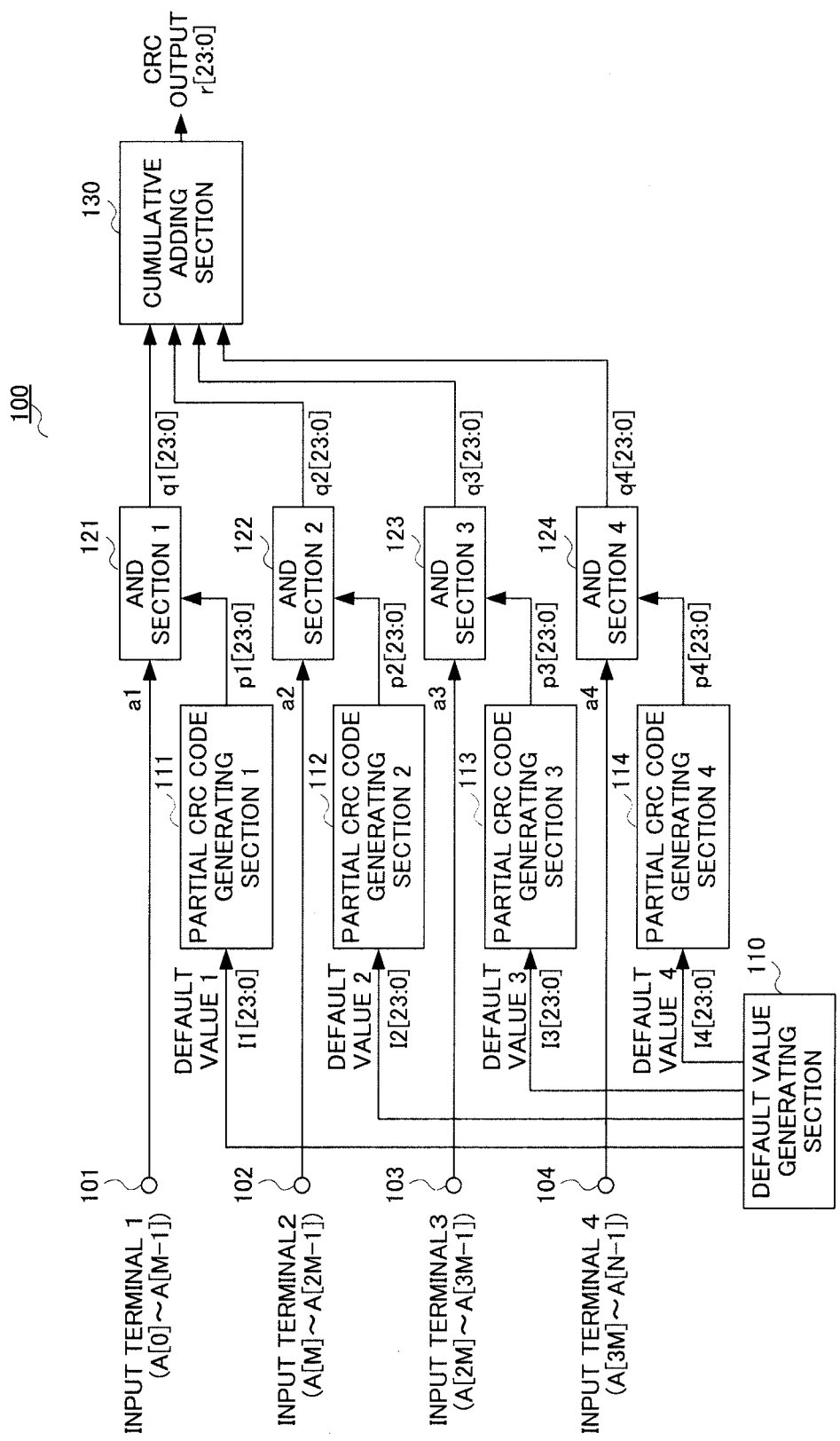
FIG. 6 is a block diagram showing an overall configuration of a parallel residue operator according to Embodiment 1 of the present invention.

FIG. 6 is a block diagram showing the overall configuration of the parallel residue operator according to Embodiment 1 of the present invention based on the above basic principle. The present embodiment is an example matching above [point 1] and [point 2]. Although an example has been described with description of [points] where data is divided into two (two parallel sequences), a case of four parallel sequences will be described with Embodiment 1 as an example. That is, input data of length n is divided into four subblocks of $i=0$ to $m-1$, $i=m$ to $2m-1$, $i=2m$ to $3m-1$ and $i=3m$ to $n-1$. Further, the length of CRC is twenty four bits ($c=24$).

In FIG. 6, parallel CRC calculating circuit (parallel residue operator) 100 is configured with input terminals 101 to 104 (input terminals <1> to <4>), initial value generating section 110, partial CRC code generating sections 111 to 114 (partial CRC code generating sections <1> to <4>), AND sections 121 to 124 (AND sections <1> to <4>) and cumulative adding section 130.

Initial value generating section 110 generates initial values I1 to I4 (initial values <1> to <4>) inputted to partial CRC code generating sections 111 to 114. To be more specific, $D^{n-1+c}$ mod $G(D)$, $D^{n-1+c-m}$ mod $G(D)$, $D^{n-1+c-2m}$ mod $G(D')$ and $D^{n-1+c-3m}$ mod $G(D)$ which are partial CRC codes (i.e. partial residues) at the head portions of $i=0, m, 2m$, and $3m$ of subblocks are generated as the initial values. The method implementing initial value generating section 110 will be described below with reference to FIG. 14 to FIG. 16.

Partial CRC code generating sections 111 to 114 (partial CRC code generating sections <1> to <4>) receive the partial CRC code matching the head of each subblock from initial value generating section 110 as the initial value and sequentially generates the rest of partial CRC codes based on the recurrence equation. Configurations and operations of partial CRC code generating sections 111 to 114 will be described later with reference to FIG. 8 to FIG. 10.

AND sections 121 to 124 (AND sections <1> to <4>) calculate AND (i.e. conjunction) of one bit inputted from input terminals 101 to 104 and a value of twenty four bits outputted from partial CRC code generating sections 111 to 114. Further, AND sections 121 to 124 only need to be logic circuits that calculate the logic of the values of partial CRC codes and are not limited to AND (i.e. conjunction). Configurations and operations of AND sections 121 to 124 will be described below with reference FIG. 11 to FIG. 12.

Cumulative adding section 130 cumulatively adds the values outputted from AND sections 121 to 124. This addition means a bitwise exclusive disjunction (i.e. EXOR). The configuration and operation of cumulative adding section 130 will be described below with reference to FIG. 13.

The operation of the parallel residue operator configured as described above will be described below. First, the operation timing of overall parallel CRC calculating circuit 100 will be described.

A case of four parallel sequences will be employed with the present embodiment as an example where data is divided into four. Further, the length of CRC is twenty four bits (c=24).

Data is divided such that the length of input data is N [bits], the length of subblocks 1 to 3 is M [bits] and the size of subblock 4 is the rest of N−3M [bits]. This division method is one example and may be set in any way.

Figure 7:
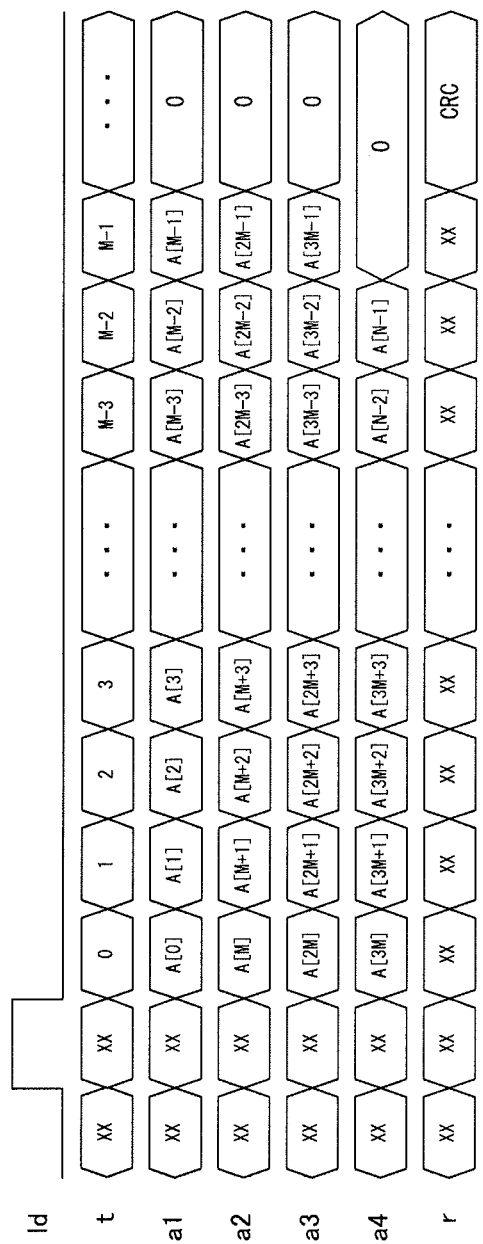
FIG. 7 is a timing chart showing input and output of data of the parallel residue operator according to above Embodiment 1.

FIG. 7 is a timing chart showing input and output of data and representing input data as A [n−1:0]. Further, t represents time in FIG. 7. The signal t in FIG. 6 is not expressly shown.

Data (A[0] to A[M−1]) of subblock 1 shown in a1 is inputted to input terminal 101 per bit beginning from A[0]. Data (A[M] to A[2M−1]) of subblock 2 shown in a2 is inputted to input terminal 102 per bit beginning from A[M]. The same applies to input terminals 103 and 104. Further, with the above example, the size of subblock 4 is different from other subblocks (that is, is one bit less than other blocks because the number of items of data matching the number of subblocks is a fraction). As shown in a4 of FIG. 7, at the time M−1, 0 is inputted to input terminal 104.

When all data is inputted, a desired CRC value is outputted from the CRC output terminal (r). With the present embodiment, after input of all data is completed, as long as the value of the input terminal is held 0, a desired CRC value is held in the output terminal (r).

Next, individual modules of parallel CRC calculating circuit 100 will be described.

[Partial CRC Code Generating Sections 111 to 114]

FIG. 8 shows a table organizing partial CRC codes calculated (processed) by partial CRC code generating sections 111 to 114. The notation of $DM\{T\}(D)$ is used. $DM\{T\}(D) = DM_T(D) = D^T \bmod G(D)$ holds.

Partial CRC code generating sections 111 to 114 (partial CRC code generating sections <1> to <4>) receive partial CRC codes matching the heads of subblocks (0, M, 2M and 3M) from initial value generating circuit 110 as the initial values, and sequentially generate the rest of partial CRC codes based on above recurrent equation 11.

For example, in the table of FIG. 8, when input data number is 0 to M−1 and the initial value is $DM\{N-1+c\}(D)$, the partial CRC code generated by partial CRC code generating section 111 of circuit number 1 is $DM\{N-1+c-1\}(D)$ to $DM\{N-1+c-(M-1)\}(D)$. Similarly, partial CRC code generating sections 112 to 114 sequentially generate partial CRC codes matching the heads of subblocks (M, 2M and 3M) as the initial values sequentially generate the rest of partial CRC codes based on above equation 11.

Next, this will be described in more detail employing partial CRC code generating section 111 as an example.

Figure 9:
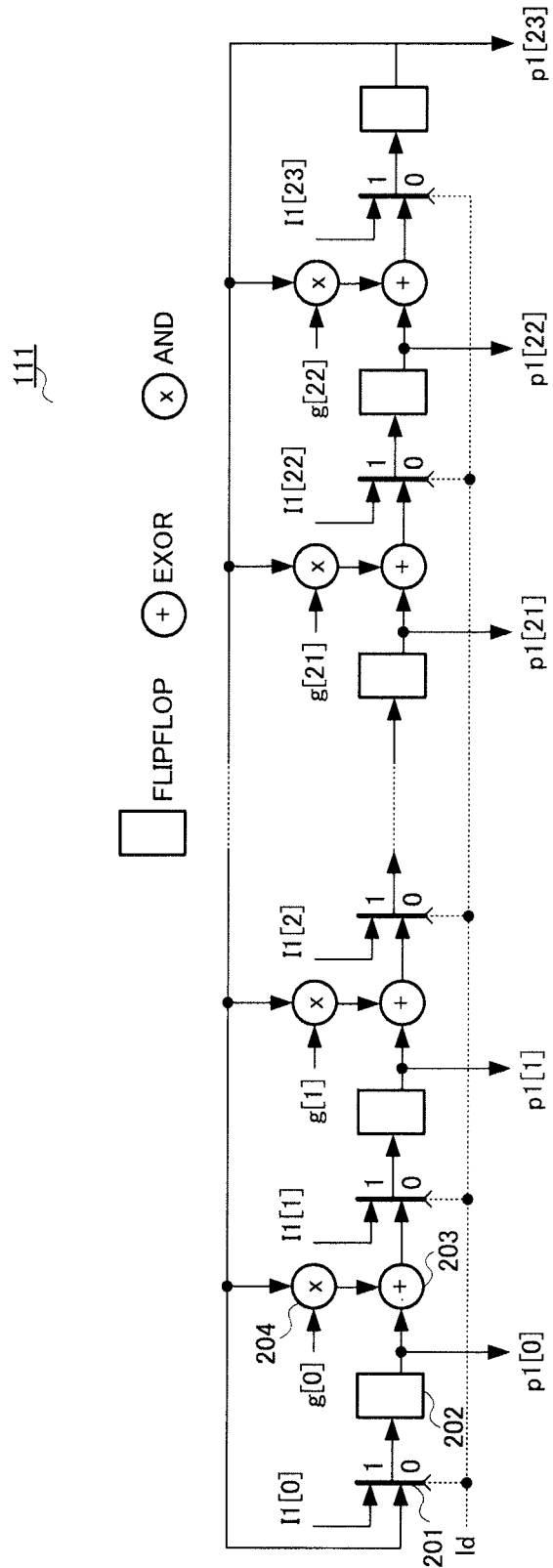
FIG. 9 shows a circuit configuration of the partial CRC code generating section of the parallel residue operator according to above Embodiment 1.

FIG. 9 shows a circuit configuration of partial CRC code generating section 111. Partial CRC code generating sections 111 to 114 employ the same configuration, and so partial CRC code generating section 111 will be described as a representative.

In FIG. 9, partial CRC code generating section 111 is composed of selectors 201, D flip flops (FF) 202, EXOR circuits 203, and AND circuits 204.

Partial CRC code generating section 111 is configured mainly by D flip flops 202 for twenty four bits. Further, the configuration linking flip flops is often referred to as "shift registers."

I1 [23:0] is the initial value and g[23:0] is a value representing the generator polynomial. For example, when the generator polynomial is defined by following equation 14: g[0]=g[17]=g[18]=g[22]=g[23]=1 and g[1]=g[2]= . . . =g[15]=g[16]=g[19]=g[20]=g[21]=0. Here, g[i] is the coefficient of $D^{c-i-1}$. The coefficient of $D^c$ is one at all times, and so g[−1] needs not to be defined.

$$G(D)=D24+D23+D6+D5+D+1 \qquad \text{(Equation 14)}$$

If this equation is represented as hexadecimal, g=C60001H p1[23:0] is the generated partial CRC code.

Next, the operation of partial CRC code generating section 111 will be described.

Figure 10:
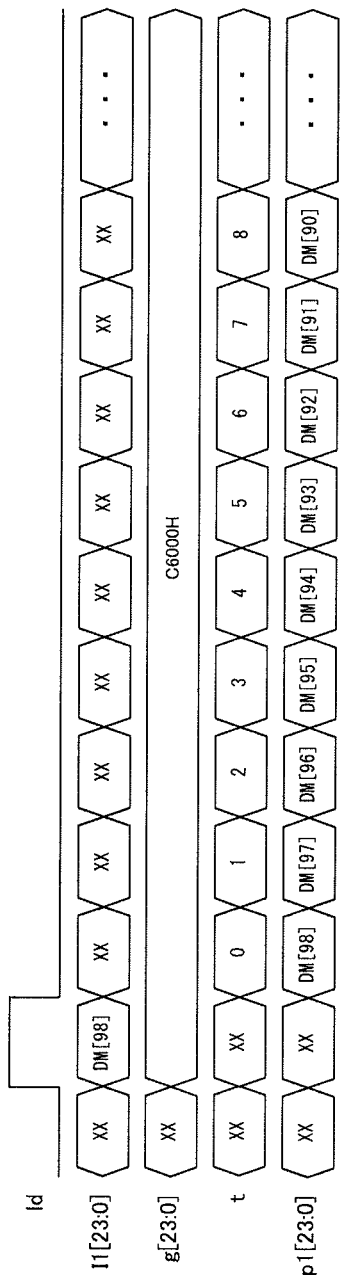
FIG. 10 is a timing chart showing the operation of the partial CRC code generating section of the parallel residue operator according to above Embodiment 1.

FIG. 10 is a timing chart showing the operation of partial CRC code generating section 111. In FIG. 10, ld is a control signal, and, when ld=1, the value of the initial value I1 is loaded to the shift register. The value of I1 is, to be more specific, $DM\{N-1+c\}(D)$ as shown in the table of FIG. 8. In the timing chart of FIG. 10, N−1+c=98 is assumed for ease of viewing.

Then, at time t=0, the loaded value is outputted as is as the partial CRC code matching A[0]. At the same time, in partial CRC code generating section 111, the value of next DM [97] is calculated based on the recurrence equation.

According to the signal name of the circuit diagram, the equation is as in following equation 15. Further, p1' (for example, DM[97]) is content of a shift register after updating, and p1 is content of a shift register (for example, DM[98]) before updating.

$$p1'[23:0]=\{p1[22:0],0\}+p1[23]*\{g[22:0],1\} \qquad \text{(Equation 15)}$$

"+" in above equation 15 represents a bitwise exclusive disjunction (i.e. EXOR) and "*" represents a conjunction (i.e. AND). Further, the notation of {p1[22:0],0} means a shift operation, which means shifting the value of p1 to an upper digit by one bit and 0 is inserted in the least significant bit (LSB). Similarly, {g[22:0],1} means a shift operation, which means inserting 1 in LSB.

As described above, partial CRC code generating sections 111 to 114 of parallel CRC calculating circuit 100 are able to calculate required partial CRC codes appropriately according to input data only with a simple configuration of shift registers and bitwise AND and EXOR circuits.

[AND Sections 121 to 124]

AND sections 121 to 124 (AND sections <1> to <4>) calculate AND (i.e. conjunction) of one bit inputted from input terminals 101 to 104 and the values of twenty four bits outputted from above partial CRC code generating sections 111 to 114.

Figure 11:
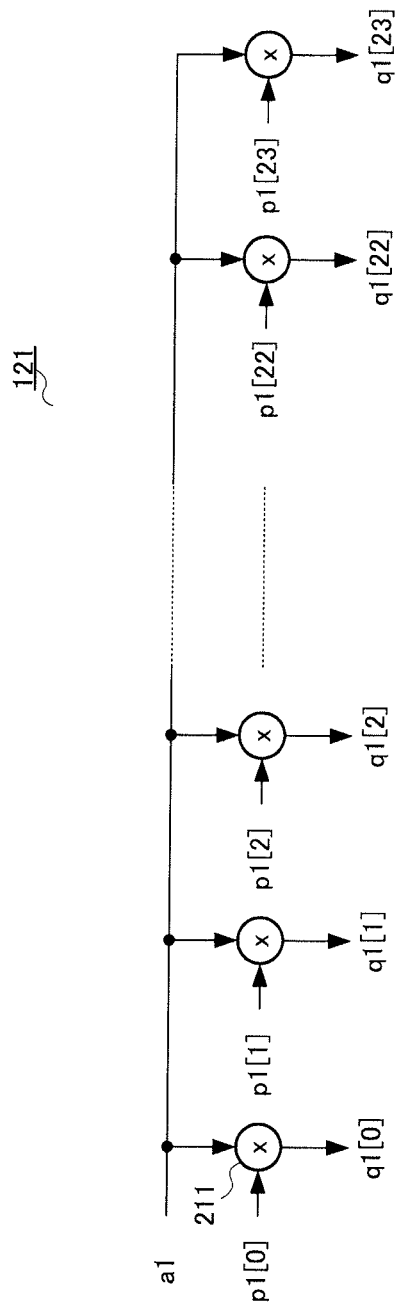
FIG. 11 shows a circuit configuration of an AND section of the parallel residue operator according to above Embodiment 1.

FIG. 11 shows a circuit configuration of AND section 121. AND sections 121 to 124 employ the same configuration, and so AND section 121 will be described as a representative.

In FIG. 11, AND section 121 is composed of AND circuit 211 that calculates AND of one bit inputted from input terminal 101 and the values of twenty four bits outputted from partial CRC code generating sections 111 to 114.

AND section 121 shown in FIG. 11 calculates AND of one bit inputted from input terminal 101 and the value of twenty four bits outputted from partial CRC code generating sections 111 to 114, which corresponds to an operation of calculating the product of $a_i$ and $D^{n-1+c-i} \bmod G(D)$ in following equation 15.

(Equation 15)

$$R(D) = A(D) \bmod G(D) \quad [11]$$

$$= \sum_{i=0}^{n-1}(a_i D^{n-1+c-i} \bmod G(D)) +$$

$$= \underbrace{\sum_{i=0}^{m-1}(a_i D^{n-1+c-i} \bmod G(D))}_{(a)} +$$

$$\underbrace{\sum_{i=m}^{n-1}(a_i D^{n-1+c-i} \bmod G(D))}_{(b)}$$

Figure 12:
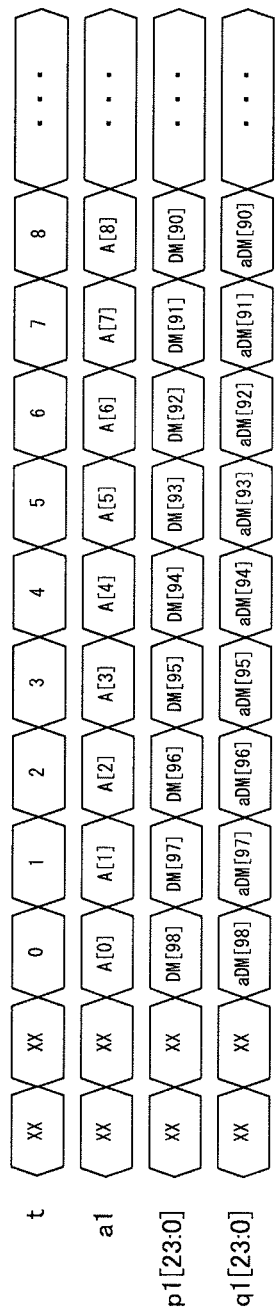
FIG. 12 is a timing chart showing the operation of the AND section of the parallel residue operator according to above Embodiment 1.

FIG. 12 is a timing chart showing the operation of AND section 121. t representing time in FIG. 12 and t in above FIG. 10 are common. That is, partial CRC code generating sections 111 to 114 generate in a timely manner partial CRC codes to be associated with input data.

[Cumulative Adding Section 130]

Figure 13:
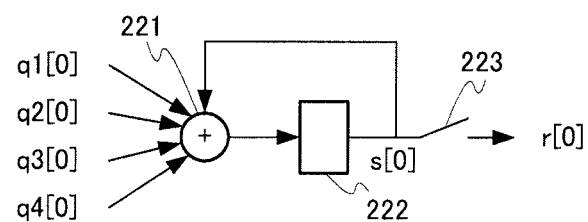
FIG. 13 shows a circuit configuration of a cumulative adding section of the parallel residue operator according to above Embodiment 1.
Figure 13:
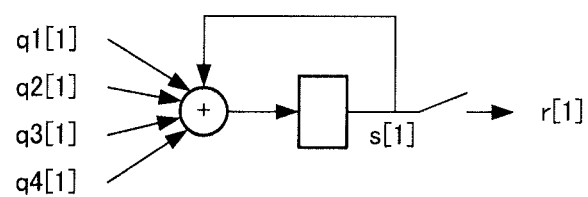
Figure 13:
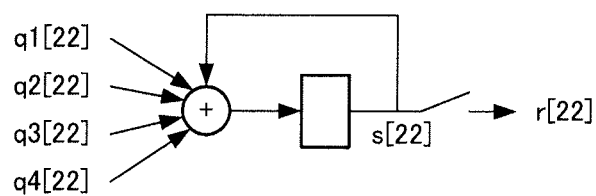
Figure 13:
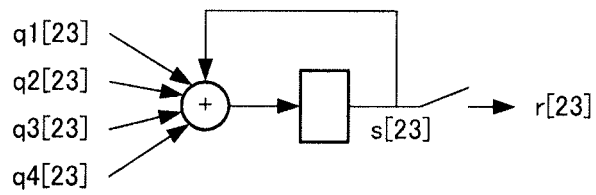

FIG. 13 shows a circuit configuration of cumulative adding section 130.

In FIG. 13, cumulative adding section 130 is composed of EXOR circuits 211, flip flops (FF) 222 and switching circuits 223.

Cumulative adding section 130 cumulatively adds values outputted from AND sections <1> to <4>. Addition here refers to a bitwise exclusive disjunction (i.e. EXOR). That is, the operation shown in following equation 16 is carried out for i=0 to 23.

$s'[i]=s[i]\text{EXOR } q1[i]\text{EXOR } q2[i]\text{EXOR } q3[i]\text{EXOR } q4[i]$ (Equation 16)

In above equation 16, "s" is the value in the flip flop before updating, and "s'" is the value in the flip flop after updating.

[Initial Value Generating Section 110]

The method of implementing initial value generating section 110 will be described.

If subblock size M and the generator polynomial are determined in advance, the required value of $D^{n+I} \bmod G(D)$ may be determined in advance and stored in a memory (RAM or ROM). Given that there are not so many varieties of I that can be adopted, the memory capacity may be little.

With the present embodiment, if subblock size M is a fixed value, only four values DM{N−1+c}(D), DM{N−1+c−M}(D), DM{N−1+c−2M}(D) and DM{N−1+c−3M}(D) need to be determined, so that the memory capacity requires only 24 bits×4 kinds=96 bits.

Further, if subblock size M and generator polynomial are changed, each time they are changed, the values may be determined by software using a CPU or DSP and stored in a RAM.

$D^{n+I} \bmod G(D)$(I=0 to N−1) may be determined by following recurrence equation 17. T=c+I and I=0 to N−1 hold.

(Equation 17)

$$D^{T+1} \bmod G(D) = (D^T \bmod G(D)) D \bmod G(D) \quad [12]$$

$$= \begin{cases} (D^T \bmod G(D))D + \\ \quad G(D) \end{cases} \text{when} \begin{pmatrix} \text{the coefficient of} \\ \text{the } \textit{highest order of} \\ D^T \bmod G(D) \\ \text{is 1} \end{pmatrix}$$

$$\quad (D^T \bmod G(D))D \quad \text{when} \begin{pmatrix} \text{the coefficient of} \\ \text{the } \textit{highest order of} \\ D^T \bmod G(D) \\ \text{is 0} \end{pmatrix}$$

Here, $D^c \bmod G(D) = G(D) - D^c$ holds.

If it is necessary to carry out the above initial value generation at high-speed, the following hardware may be used.

Figure 14:
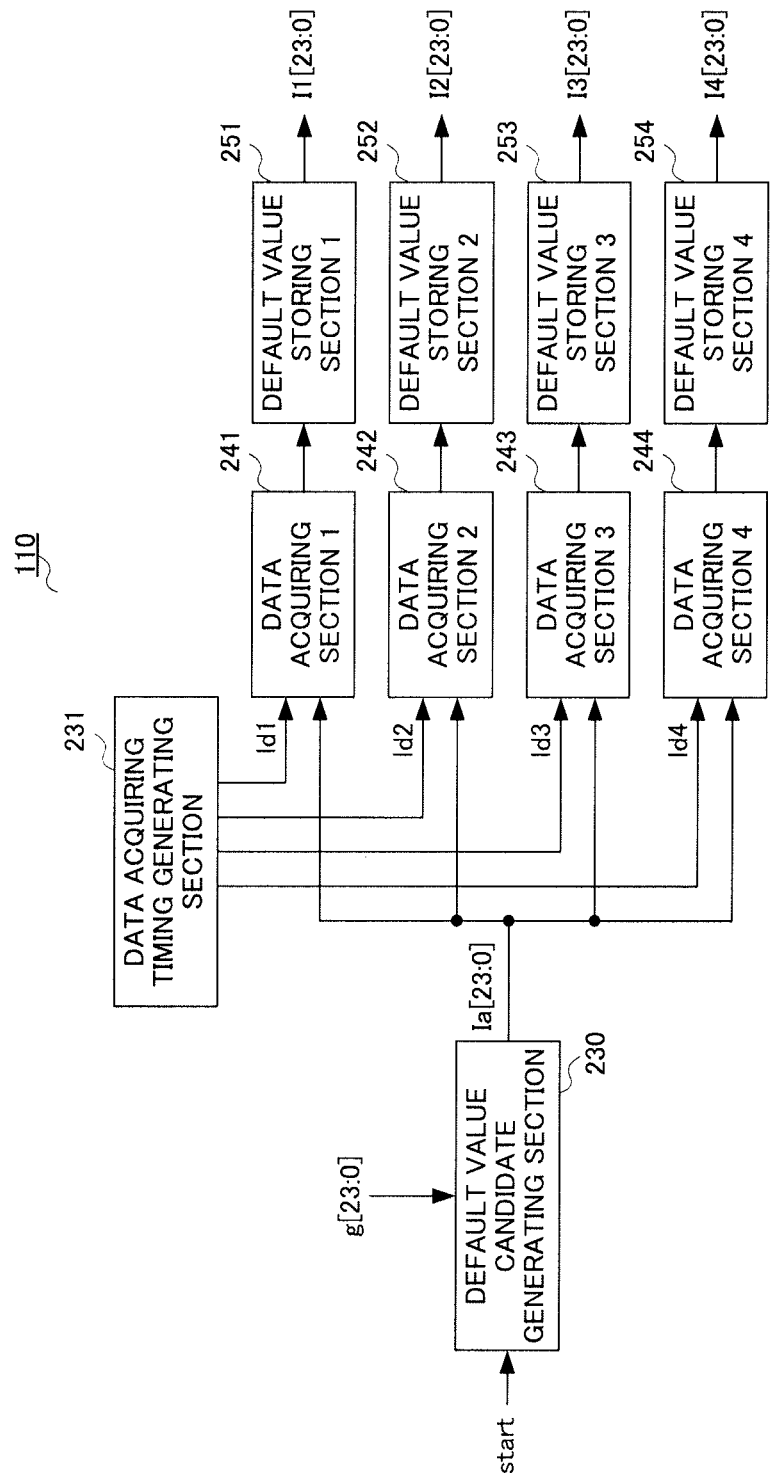
FIG. 14 is a block diagram showing a configuration of a initial value generating section of the parallel residue operator according to above Embodiment 1.

FIG. 14 is a block diagram showing a configuration of initial value generating section 110.

In FIG. 14, initial value generating section 110 is configured with initial value candidate generating section 230, data acquiring timing generating section 231, data acquiring sections 241 to 244 (data acquiring sections <1> to <4>) and initial value storing sections 251 to 254 (initial value storing sections <1> to <4>).

Figure 15:
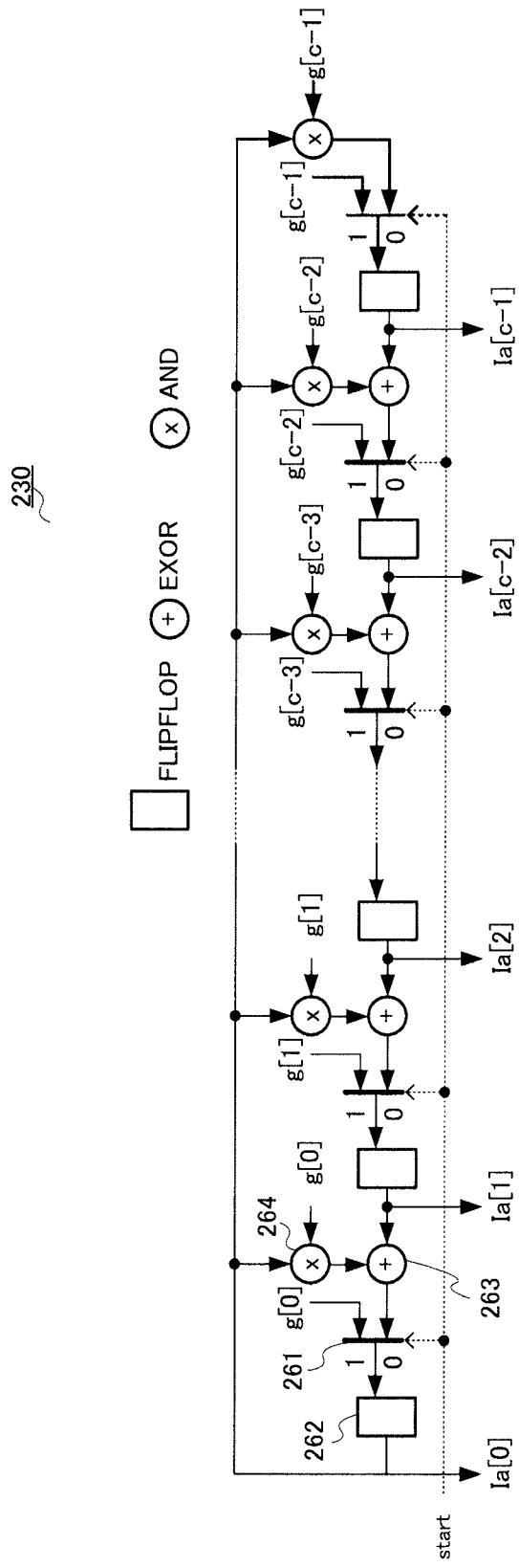
FIG. 15 shows a circuit configuration of the initial value candidate generating section of the parallel residue operator according to above Embodiment 1.

FIG. 15 shows a circuit configuration of above initial value candidate generating section 230.

In FIG. 15, initial value candidate generating section 230 is composed of selectors 261, flip flops (FF) 262, EXOR circuits 263 and AND circuits 264.

Initial value candidate generating section 230 finds values of $D^{n+I} \bmod G(D)$ sequentially from I=0 to N−1. The internal configuration is as shown in FIG. 15.

Figure 16:
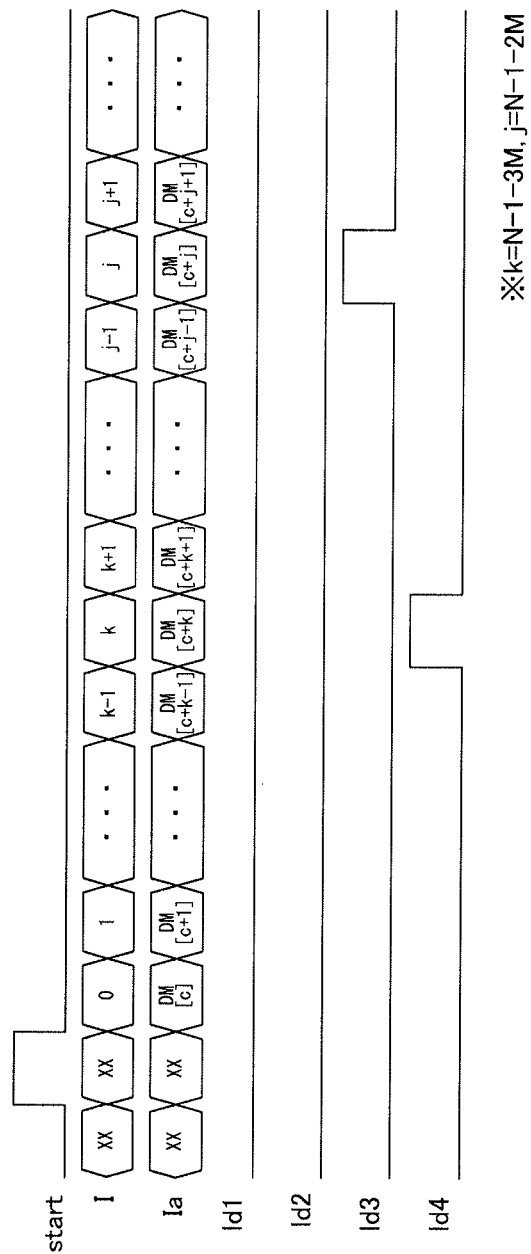
FIG. 16 is a timing chart showing the operation of the initial value generating section of the parallel residue operator according to above Embodiment 1.

FIG. 16 is a timing chart showing the operation of initial value generating section 110.

Data acquiring section 241 (data acquiring section <1>) acquires the initial value DM {N−1+c} (D) used in partial CRC code generating section 111 (see FIG. 6) and stores the initial value in initial value storing section 251 (initial value storing section <1>). That is, as shown in FIG. 16, data acquiring timing generating section 231 transmits a trigger signal when initial value candidate generating section 230 outputs DM{N−1+c}(D). By acquiring the output of initial value candidate generating section 230 according to a trigger signal of ld1, data acquiring section 241 is able to acquire the value DM{N−1+c} to be stored in initial value storing section 1.

Similarly, a trigger signal is outputted to ld2 at a timing at which DM{N−1+c−M} (D) is outputted, a trigger signal is outputted to ld3 at a timing (I=j=N−1−2M) at which DM{N−1+c−2M} (D) is outputted, and a trigger signal is outputted to ld4 at a timing (I=k=N−1−3M) at which DM{N−1+c−3M} (D) is outputted.

As described above, according to the present embodiment, parallel CRC calculating circuit 100 has: input terminals 101 to 104 to which input data divided into a plurality of subblocks is inputted in parallel; initial value generating section 110 that generates partial CRC codes matching the head portions of subblocks as the initial values; partial CRC code generating sections 111 to 114 that receive the partial CRC codes matching the heads of the subblocks and sequentially generate the rest of partial CRC codes according to a predetermined recurrence equation; AND sections 121 to 124 that calculate a conjunction of the values of partial CRC codes; and cumulative adding section 130 that cumulatively adds the values outputted from AND sections 121 to 124. In partial CRC code generation, the partial CRC codes matching the head portions of the subblocks are generated by changing the equation for the residue R(D) shown with respect to the order (i=n−1−m+c) obtained by adding the order c of the generator polynomial to the order (n−1−m) of the m-th input, to an equation represented by the sum of the partial CRC codes ($D^{n-1+c-i}$ mod G(D)). Consequently, according the present embodiment, processing delay can be reduced and an additional multiplying circuit and residue circuit are not required, so that the circuit scale can be made smaller. A specific advantage is as follows.

(1) With the conventional configuration, CRC codes of divided input data are determined and then combined and so additional multiplying circuits and residue circuits are required, and therefore the circuit scale and processing delay are increased. According to the present embodiment, by providing a number of partial CRC code generating sections 111 to 114 matching the degree of the parallelism, it is possible to carry out parallel CRC calculation in form of divided subblocks with a simple configuration. Further, there are advantages of reducing delay because AND circuits can be used instead of conventional multiplying circuits and, further, making delay and the circuit scale smaller because an additional residue calculating circuit is not required in the final part.

(2) With the conventional configuration as in the conventional example 2, partial CRC codes need to be determined in advance, and therefore the memory capacity is increased in proportion to the size of input data. By contrast with this, according to the present embodiment, partial CRC code generating sections 111 to 114 sequentially generate new values based on the initial values, so that it is possible to calculate partial CRC codes with the circuit scale and memory capacity regardless of the size of input data.

(3) According to the present embodiment, a method of sequentially calculating partial CRC codes using shift registers is employed, so that it is possible to calculate partial CRC codes with a small circuit without division operation on the polynomials defined in mod G(D).

In this way, a new configuration of the subblock dividing type parallel CRC circuit can be realized. When used in combination with a turbo decoder, the subblock dividing parallel CRC circuit is able to reduce processing delay and shorten the delay produced before ACK/NACK transmission is carried out. When iterative decoding of turbo code is carried out, CRC decision can be carried out instantly per iteration, so that it is possible to stop decoding earlier and reduce power consumption. The access to the interface memory between the turbo decoder and the CRC calculating circuit can be eliminated, so that it is possible to reduce power consumption.

As described above, particularly when combined with the turbo decoder that carries out subblock division, the present invention is able to reduce the processing delay significantly. Regardless of types of turbo code, the present invention is applicable for a general purpose and can be implemented at ease.

Embodiment 2

Figure 17:
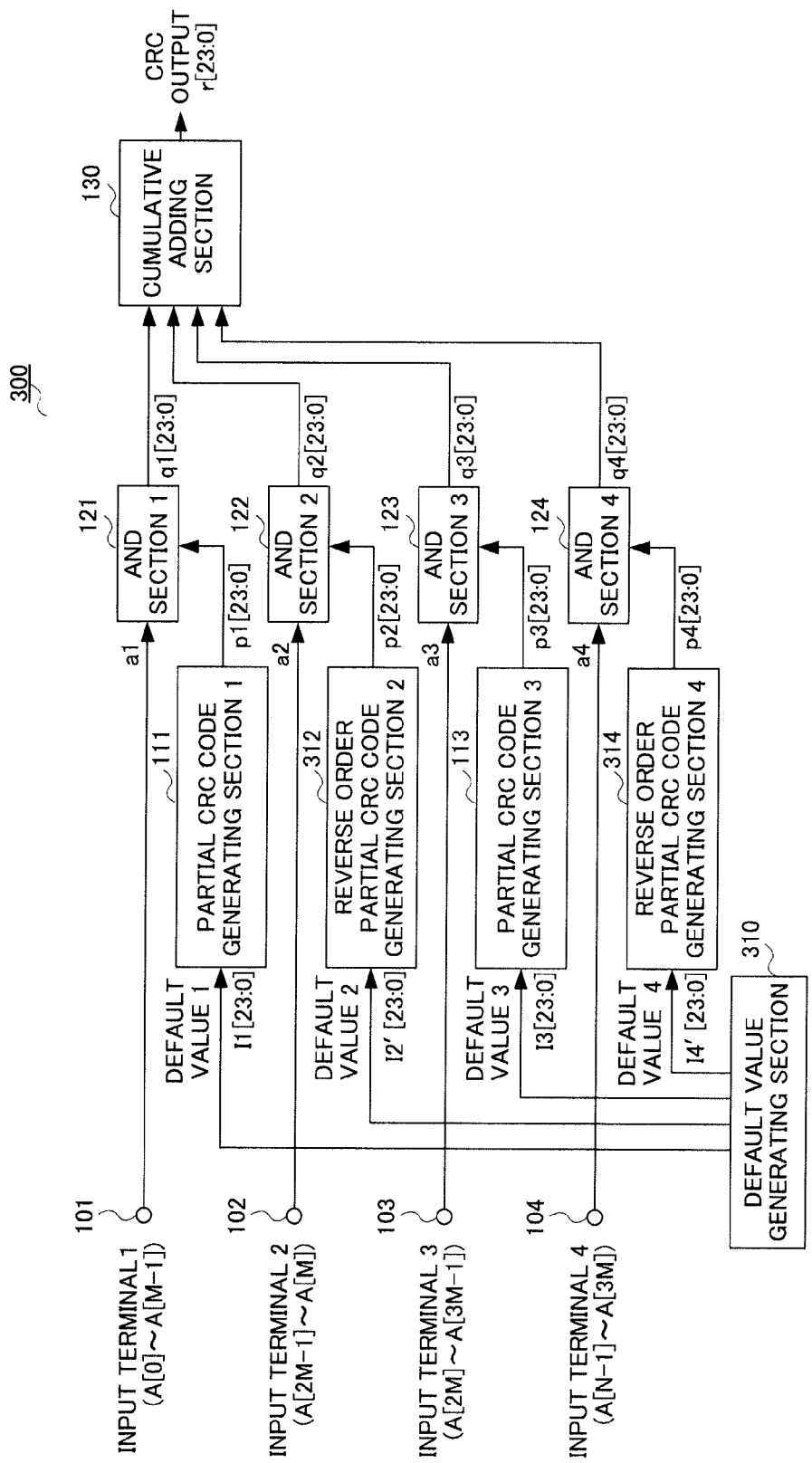
FIG. 17 is a block diagram showing the overall configuration of the parallel residue operator according to Embodiment 2 of the present invention.

FIG. 17 is a block diagram showing the overall configuration of the parallel residue operator according to Embodiment 2 of the present invention. The same reference numerals are assigned to the same parts as in FIG. 6.

The present embodiment is an example matching [point 3] described in the basic principle. An example has been described with [point 3] where the data input order is reversed per subblock. A case will be described as an example where, in four parallel sequences dividing data into four, the order is reversed for the subblock <2> and subblock <4>.

In FIG. 17, parallel CRC calculating circuit (parallel residue operator) 300 is configured with input terminals 101 to 104 (input terminals <1> to <4>), initial value generating section 310, partial CRC code generating sections 111 and 113 (partial CRC code generating sections <1> and <3>), reverse order partial CRC code generating sections 312 and 314 (reverse order partial CRC code generating sections <2> and <4>), AND sections 121 to 124 (AND sections <1> to <4>) and cumulative adding section 130.

FIG. 17 shows an example where parallel CRC calculating circuit 300 employs subblock size M and data is inputted in reverse order only to input terminals 102 and 104.

Features of the configuration are as follows.

Compared to parallel CRC calculating circuit 100 of FIG. 6, partial CRC code generating sections 112 and 114 are replaced with reverse order partial CRC code generating sections 312 and 314. Further, the initial values to input to reverse order partial CRC code generating sections 312 and 314 are changed. Consequently, the initial values generated in initial value generating section 310 are different from initial value generating section 110 of FIG. 6, but the configuration is the same (see FIG. 14).

Figure 18:
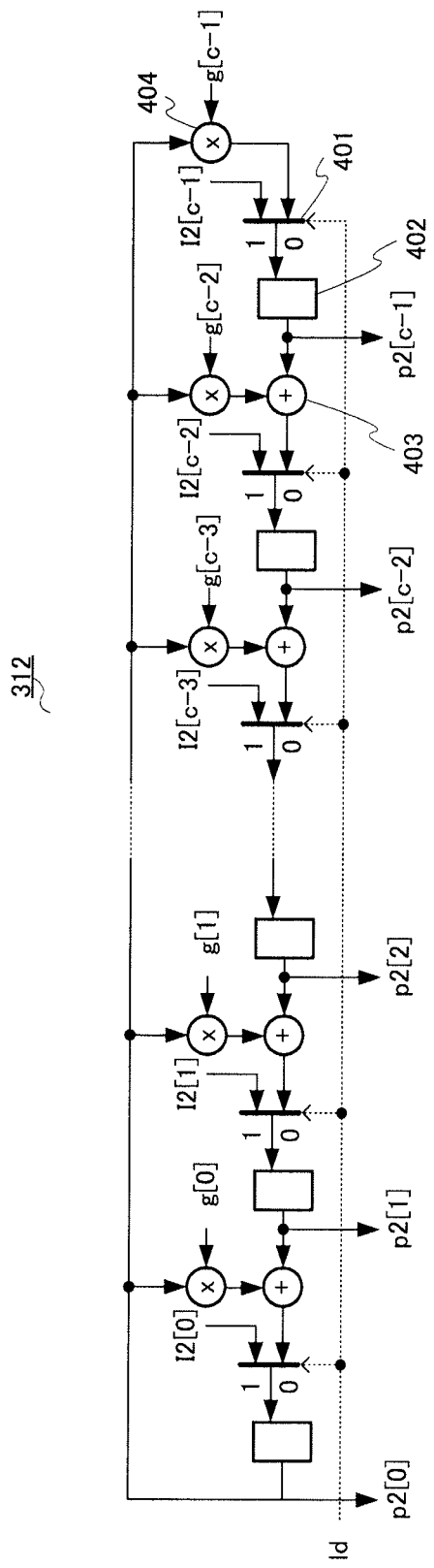
FIG. 18 shows a circuit configuration of a reverse order partial CRC code generating section of the parallel residue operator according to above Embodiment 2.

FIG. 18 shows a circuit configuration of reverse order partial CRC code generating section 312. Reverse order partial CRC code generating sections 312 and 314 employ the same configuration, and so reverse order partial CRC code generating section 312 will be described as a representative.

In FIG. 18, reverse order partial CRC code generating section 312 is composed of selectors 401, D flip flops (FF) 402, EXOR circuits 403 and AND circuits 404.

Similar to partial CRC code generating section 111 (see FIG. 9), although reverse order partial CRC code generating section 312 is configured mainly by D flip flops 402, the orientation of generated data is opposite.

FIG. 19 shows a table organizing partial CRC codes calculated (processed) by partial CRC code generating sections, that is, partial CRC code generating section 111, reverse order partial CRC code generating section 312, partial CRC code generating section 113, and reverse order partial CRC code generating section 314. Here, notation of DM{T} (D) is used. DM{T} (D)=$DM_T$(D)=$D^T$ mod G(D) holds.

As shown in the table of FIG. 19, the order of input data for circuit numbers 2 and 4 is reversed, and, accompanying this, the order of generation of initial values and partial CRC codes are changed.

As described in [point 3] of the basic principle, values of DM{N−1+c−(2M−2)} (D) to DM{N−1+c−M} (D) are sequentially calculated based on following recurrence equation 18 using DM{N−1+c−(2M−1)} (D) as the initial value.

(Equation 18)

$$DM_{T+1}(D) = \begin{cases} DM_T(D)D + G(D) & \text{when} \left(\begin{array}{l}\text{the coefficient of the highest}\\ \text{order of } DM(T) \text{ is } 0\end{array}\right) \\ DM_T(D)D & \text{when} \left(\begin{array}{l}\text{the coefficient of the highest}\\ \text{order of } DM(T) \text{ is } 1\end{array}\right) \end{cases} \quad [13]$$

Normal order partial CRC code generating sections 111 and 113 carry out a calculation while decreasing T, and reverse order partial CRC code generating sections 312 and 314 carry out a calculation while increasing T.

As described above, initial value generating section 310 employs the same configuration as partial CRC code generating section 111 of Embodiment 1. However, the initial value required in reverse order partial CRC code generating section 312 is not $DM\{N-1+c-M\}(D)$, but is $DM\{N-1+c-(2M-1)\}(D)$, and so timings at which triggers for ld2 are generated are different. That is, ld2=1 holds at the timing of $I=N-1-(2M-1)$. The same applies to the timing of ld4, and l4=0 holds at the timing of I=0.

Figure 20:
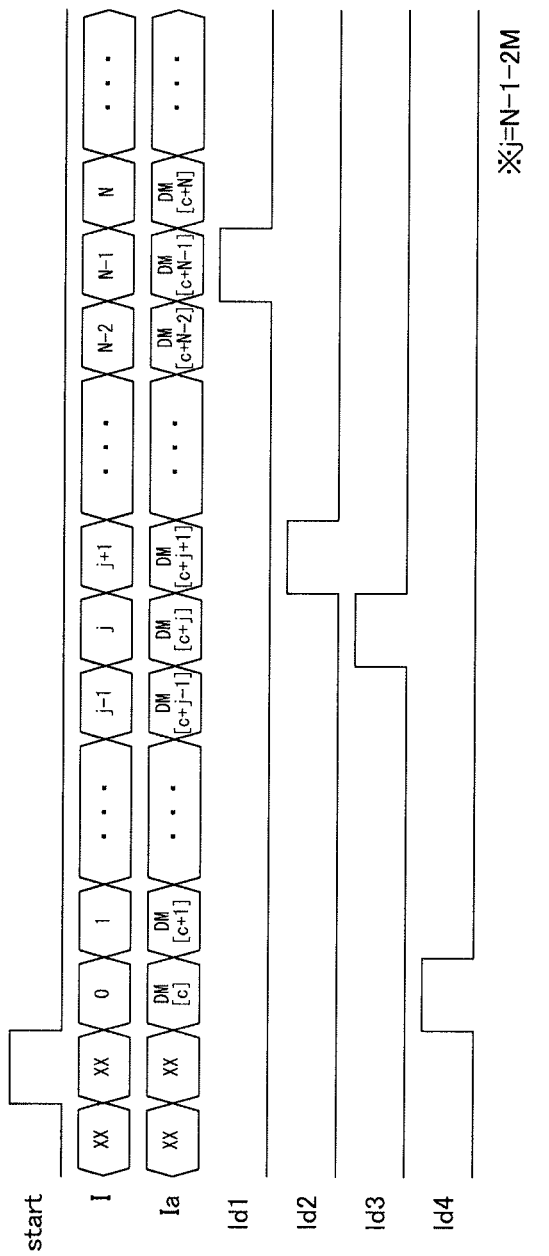
FIG. 20 is a timing chart showing the operation of the initial value generating section of the parallel residue operator according to above Embodiment 2.

FIG. 20 is a timing chart showing the operation of initial value generating section 310. Upon comparison of the timing chart of FIG. 20 and the timing chart of FIG. 16 showing the operation of initial value generating section 110 of parallel CRC calculating circuit 100, timings at which triggers are outputted to signals ld2 and ld4 are different.

In this way, according to the present embodiment, it is possible to input data in reverse order per subblock in addition to the effect of Embodiment 1. Consequently, the combination of the present invention and a parallel turbo decoder that carries out subblock division is highly compatible. For example, when Max-log-MAP decoding is carried out in the turbo decoder, it is possible to input the output of the turbo decoder directly to this parallel CRC calculating circuit (parallel residue operator) 300. Particularly, when the present invention is combined with the parallel turbo decoder that carries out subblock division, it is possible to reduce processing delay significantly.

The above description is an illustration of preferred embodiments of the present invention, and the scope of the present invention is not limited to this.

For example, although cases have been described with the above embodiments where data is divided into four (four parallel sequences), the number of divisions and the bit length of CRC code are not limited to this.

Further, although, with above Embodiment 1, partial CRC code generating section 111 generates one partial CRC code per clock cycle as shown in FIG. 10 according to equation 8, two or more partial CRC codes may be calculated per clock cycle by repeatedly using equation 8. For example, partial CRC code generating section 111 outputs two partial CRC codes $DM\{N-1+c+i+1\}(D)$ and $DM\{N-1+c+i+2\}(D)$ from DM $\{N-1+c+i\}$ (D) (where i is an integer). With such a configuration, two bit data can be inputted per one clock cycle to input terminals 101 to 104. That is, when data of each subblock is subjected to serial-to-parallel conversion after dividing data into subblocks, parallel calculation is possible with a simple configuration by using the methods described as [point 1] and [point 2] in this description.

Further, although, with above Embodiment 2, data is inputted in reverse order to subblocks 2 and 4, data may be inputted in reverse order to any subblock or only to part of subblocks.

Further, although, with the present embodiment, the terms "parallel residue operator" and "parallel CRC calculating circuit" have been used for ease of description, the terms "CRC calculating circuit," "error correction circuit" and "error correction method" may be used.

Further, the present invention only needs to be realized by a parallel residue operator and parallel residue operation method based on this algorithm, and the present invention can be realized naturally with hardware configuration and can also be realized by software for functioning the parallel residue operation method. This software is stored in a computer readable recording medium.

Each function block employed in the description of each of the aforementioned embodiments may typically be implemented as an LSI constituted by an integrated circuit. These may be individual chips or partially or totally contained on a single chip. "LSI" is adopted here but this may also be referred to as "IC," "system LSI," "super LSI," or "ultra LSI" depending on differing extents of integration. Further, the method of circuit integration is not limited to LSI's, and implementation using dedicated circuitry or general purpose processors is also possible. After LSI manufacture, utilization of a programmable FPGA (Field Programmable Gate Array) or a reconfigurable processor where connections and settings of circuit cells within an LSI can be reconfigured is also possible. Further, if integrated circuit technology comes out to replace LSI's as a result of the advancement of semiconductor technology or a derivative other technology, it is naturally also possible to carry out function block integration using this technology. Application of biotechnology is also possible.

The disclosure of Japanese Patent Application No. 2006-225934, filed on Aug. 22, 2006, including the specification, drawings and abstract, is incorporated herein by reference in its entirety.

INDUSTRIAL APPLICABILITY

The parallel residue operator and parallel residue calculation method according to the present invention are useful as a novel parallel residue operator and parallel residue operation method used instead of a conventional CRC calculating circuit in a communication system where outputs of, for example, a turbo decoder are inputted in parallel and errors in digital information are detected. For example, to decode transmission data encoded by, for example, convolution code for error correction or turbo coding, the parallel residue operator and parallel residue calculation method are preferable at the receiving end for use in a soft output decoder such as a Viterbi decoder or turbo decoder, a receiving apparatus using cyclic code for detecting whether or not there are transmission errors or a communication terminal apparatus such as a mobile telephone.

The invention claimed is:

1. A parallel residue operator to which input data divided into a plurality of subblocks is inputted in parallel, the parallel residue operator comprising:

an initial value generating section that generates partial residues matching head portions of the respective subblocks as initial values;

a partial residue generating section that receives the generated partial residues from the initial value generating section as the initial values and sequentially generates a rest of partial residues according to a predetermined recurrence equation;

a logic section that calculates logical operations of the input data and values of partial residues outputted from the partial residue generating section; and a cumulative adding section that cumulatively adds the values outputted from the logic section, wherein the predetermined recurrence equation is as follows:

when $DM_T(D)=D^T \bmod G(D)$, $DM_{T-1}(D)=(DM_T(D)+G(D))>>1$ when the coefficient of the lowest order of $DM_T(D)$ is 1, and $DM_{T-1}(D)=DM_T(D)>>1$ when the coefficient of the lowest order of $DM_T(D)$ is 0.

2. A parallel residue operator to which input data divided into a plurality of subblocks is inputted in parallel, the parallel residue operator comprising:
- an initial value generating section that generates partial residues matching tail portions of the respective subblocks as initial values;
- a reverse order partial residue generating section that receives the generated partial residues from the initial value generating section as the initial values and sequentially generates a rest of partial residues according to a predetermined recurrence equation;
- a logic section that calculates logical operations of the input data and values of reverse order partial residues outputted from the reverse order partial residue generating section; and
- a cumulative adding section that cumulatively adds the values outputted from the logic section,
- wherein the predetermined recurrence equation is as follows:

when $DM_T(D)=D^T \bmod G(D)$, $DM_{T+1}(D)=(DM_T(D)D+G(D))$ when the coefficient of the highest order of $DM_T(D)$ is 1, and $DM_{T+1}(D)=DM_T(D)D$ when the coefficient of the highest order of $DM_T(D)$ is 0.

3. The parallel residue operator according to claim 1, wherein, when input data of a length n is divided into data sequences of lengths n-m and m and the individual divided data sequences are made the subblocks, the initial value generating section generates as the initial values $D^{n-1+c} \bmod G(D)$ and $D^{n-1+c-m} \bmod G(D)$, which are partial residues at head portions of respective subblocks of i=0 and m, according to a value of a polynomial G(D) determined by a maximum order c.

4. The parallel residue operator according to claim 2, wherein, when input data of a length n is divided into data sequences of lengths n-m and m and the individual divided data sequences are made the subblocks, the initial value generating section generates as the initial values $D^{n-1+c-(m-1)} \bmod G(D)$ and $D^{n-1+c-(n-1)} \bmod G(D)$, which are partial residues at tail portions of respective subblocks of i=m-1 and n-1, according to a value of a polynomial G(D) determined by a maximum order c.

5. The parallel residue operator according to claim 1, wherein the partial residue generating section receives as input data according to an original data order, and calculates partial residues matching i=1 to m-1 and i=m+1 to n-1 according to a predetermined recurrence equation using $D^{n-1+c} \bmod G(D)$ and $D^{n-1+c-m} \bmod G(D)$ as the initial values.

6. The parallel residue operator according to claim 2, wherein the reverse order partial residue generating section receives as input data in a reverse order of an original data order, and calculates reverse order partial residues matching i=m-2 to 0 and i=n-2 to m according to a predetermined recurrence equation using $D^{n-1+c-(m-1)} \bmod G(D)$ and $D^{n-1+c-(n-1)} \bmod G(D)$ as the initial values.

7. The parallel residue operator according to claim 1, wherein the cumulative adding section adds a bitwise exclusive disjunction.

8. A parallel residue operation method in which input data divided into a plurality of subblocks is inputted in parallel, the parallel residue operation method comprising:
- generating, by an initial value generating section, partial residues matching head portions of the respective subblocks as initial values;
- receiving, by a partial residue generating section, the generated partial residues from the initial value generating section as the initial values and sequentially generating a rest of partial residues according to a predetermined recurrence equation;
- calculating, by a logic section, logical operations of the input data and values of partial residues outputted from the partial residue generating section; and
- cumulatively adding, by a cumulative adding section, the values outputted from the logic section,
- wherein the predetermined recurrence equation is as follows:

when $DM_T(D)=D^T \bmod G(D)$, $DM_{T-1}(D)=(DM_T(D)+G(D))>>1$ when the coefficient of the lowest order of $DM_T(D)$ is 1, and $DM_{T-1}(D)=DM_T(D)>>1$ when the coefficient of the lowest order of $DM_T(D)$ is 0.

9. A parallel residue operation method in which input data divided into a plurality of subblocks is inputted in parallel, the parallel residue operation method comprising:
- generating, by an initial value generating section, partial residues matching tail portions of the respective subblocks as initial values;
- receiving, by a reverse order partial residue generating section, the generated partial residues from the initial value generating section as the initial values and sequentially generating a rest of partial residues according to a predetermined recurrence equation;
- calculating, by a logic section, logical operations of the input data and values of reverse order partial residues outputted from the reverse order partial residue generating section; and
- cumulatively adding, by a cumulative adding section, the values outputted from the logic section,
- wherein the predetermined recurrence equation is as follows:

when $DM_T(D)=D^T \bmod G(D)$, $DM_{T+1}(D)=(DM_T(D)D+G(D)$ when the coefficient of the highest order of $DM_T(D)$ is 1, and $DM_{T+1}(D)=DM_T(D)D$ when the coefficient of the highest order of $DM_T(D)$ is 0.

10. The parallel residue operation method according to claim 8,
wherein, when input data of a length n is divided into data sequences of lengths n-m and m and the individual divided data sequences are made the subblocks, the initial value generating section generates as the initial values $D^{n-1+c} \bmod G(D)$ and $D^{n-1+c-m} \bmod G(D)$, which are partial residues at head portions of respective subblocks of i=0 and m, according to a value of a polynomial G(D) determined by a maximum order c.

11. The parallel residue operation method according to claim 9,
wherein, when input data of a length n is divided into data sequences of lengths n-m and m and the individual divided data sequences are made the subblocks, the initial value generating section generates as the initial values $D^{n-1+c-(m-1)} \bmod G(D)$ and $D^{n-1+c-(n-1)} \bmod G(D)$, which are partial residues at tail portions of respective subblocks of i=m−1 and n−1, according to a value of a polynomial G(D) determined by a maximum order c.

12. The parallel residue operation method according to claim 8,
wherein the partial residue generating section receives as input data according to an original data order, and calculates partial residues matching i=1 to m−1 and i=m+1 to n−1 according to a predetermined recurrence equation using $D^{n-1+c}$ mod G(D) and $D^{n-1+c-m}$ mod G(D) as the initial values.

13. The parallel residue operation method according to claim 9,
wherein the reverse order partial residue generating section receives as input data in a reverse order of an original data order, and calculates reverse order partial residues matching i=m−2 to 0 and i=n−2 to m according to a predetermined recurrence equation using $D^{n-1+c-(m-1)}$ mod G(D) and $D^{n-1+c-(n-1)}$ mod G(D) as the initial values.

14. The parallel residue operation method according to claim 8,
wherein the cumulative adding section adds a bitwise exclusive disjunction.

\* \* \* \* \*